(12) United States Patent
Yeh et al.

(10) Patent No.: US 12,191,817 B2
(45) Date of Patent: Jan. 7, 2025

(54) PERIPHERAL FOR AMPLIFIER LINEARIZATION WITH COMPLIMENTARY COMPENSATION

(71) Applicant: Kyocera International Inc., San Diego, CA (US)

(72) Inventors: Jin-Fu Yeh, San Diego, CA (US); James June-Ming Wang, Pasadena, CA (US); Yuh-Min Lin, San Diego, CA (US)

(73) Assignee: Kyocera International Inc., San Diego, CA (US)

( * ) Notice: Subject to any disclaimer, the term of this patent is extended or adjusted under 35 U.S.C. 154(b) by 654 days.

(21) Appl. No.: 17/406,630

(22) Filed: Aug. 19, 2021

(65) Prior Publication Data

US 2022/0060153 A1 Feb. 24, 2022

Related U.S. Application Data

(60) Provisional application No. 63/067,519, filed on Aug. 19, 2020.

(51) Int. Cl.
| | | |
|---|---|---|
| *H03F 1/32* | (2006.01) | |
| *H03F 1/56* | (2006.01) | |
| *H03F 3/21* | (2006.01) | |
| *H03F 3/45* | (2006.01) | |

(52) U.S. Cl.
CPC ......... *H03F 1/3211* (2013.01); *H03F 1/3205* (2013.01); *H03F 1/565* (2013.01); *H03F 3/21* (2013.01); *H03F 3/45264* (2013.01); *H03F 2200/222* (2013.01); *H03F 2200/451* (2013.01)

(58) Field of Classification Search
CPC ...... H03F 1/3211; H03F 1/3205; H03F 1/565; H03F 3/21; H03F 3/45261
See application file for complete search history.

(56) References Cited

U.S. PATENT DOCUMENTS

| | | | |
|---|---|---|---|
| 9,344,036 B1 * | 5/2016 | Chang ................. | H03B 5/1278 |
| 2004/0119536 A1 | 6/2004 | Kwon et al. .................. | 330/254 |
| 2008/0315936 A1 | 12/2008 | Mauthe ...................... | H03L 5/00 |
| 2009/0153244 A1 | 6/2009 | Jose et al. ..................... | 330/253 |

(Continued)

OTHER PUBLICATIONS

PCT prepared International Search Report and Written Opinion for application PCT/US2021/046784 dated Dec. 9, 2021.

(Continued)

*Primary Examiner* — Patricia T Nguyen
(74) *Attorney, Agent, or Firm* — Helen Mao; Imperium Patent Works

(57) ABSTRACT

A power amplifier (PA) linearization technique with a wider linearized power range is proposed. Proposed two types of linearizers with cross-coupled PMOS and NMOS configuration. The idea is to use a complimentary device compared with the PA core device, and the behavior of Cgs of the linearizer are also complimentary to the PA itself. In the other words, the overall Cgs of the PA with the linearizer would be constant without leading to non-linear waveform. Both linearizers can effectively compensate not only AMAM but also AMPM. First type of linearizer can be integrated with PA cores, and second type of linearizer can be used in the IMN. Both linearizers have effective IM3 reduction in different corner.

10 Claims, 6 Drawing Sheets

(56) References Cited

U.S. PATENT DOCUMENTS

| | | | |
|---|---|---|---|
| 2010/0164761 A1 | 7/2010 | Wan et al. | 341/108 |
| 2012/0200358 A1 | 8/2012 | Kuang | 330/257 |
| 2013/0033321 A1* | 2/2013 | Lindstrand | H03F 3/45188 |
| | | | 330/253 |
| 2017/0373640 A1 | 12/2017 | Xiaoping et al. | H03D 7/14 |
| 2019/0109561 A1* | 4/2019 | Bahr | H03B 5/30 |
| 2019/0296756 A1* | 9/2019 | Ali | H03F 3/45237 |
| 2020/0021272 A1* | 1/2020 | Segovia Fernandez | |
| | | | H03B 5/326 |
| 2020/0373908 A1* | 11/2020 | Yen | H03H 9/0547 |
| 2022/0103776 A1* | 3/2022 | Prathipati | H03F 3/45264 |

OTHER PUBLICATIONS

A capacitance-compensation technique for improved linearity in CMOS Class-AB Power Amplifiers, IEEE Journal of Solid-State Circuits, vol. 39, No. 11, Nov. 2004.

European Intellectual Property Office Action 21859170.9 / PCT/US202106784, dated Aug. 28, 2024 (14 pages).

* cited by examiner

PERIPHERAL FOR AMPLIFIER LINEARIZATION WITH COMPLIMENTARY COMPENSATION

CROSS REFERENCE TO RELATED APPLICATIONS

This application claims priority under 35 U.S.C. § 119 from U.S. Provisional Application No. 63/067,519, entitled "Peripheral for Amplifier Linearization with Complimentary Compensation," filed on Aug. 19, 2020, the subject matter of which is incorporated herein by reference.

TECHNICAL FIELD

The disclosed embodiments relate generally to power amplifier, and, more particularly, to peripheral design for radio frequency (RF) amplifier linearization using complementary compensation.

BACKGROUND

A fundamental component of a mobile communication system is power amplifiers (PAs). Power amplifiers are indispensable component in the mobile communication system and are inherently nonlinear. To reduce the nonlinearity, a power amplifier can be backed off to operate within the linear portion of its operating curve. To improve the power amplifier efficiency without compromising its linearity, power amplifier linearity is essential. Various linearization techniques for power amplifiers are used for linearity and power efficiency improvement in mobile communication systems.

FIG. 1 (prior art) illustrates an NMOS power amplifier PA 100 biased at lower bias condition. In order to achieve good efficiency and high power, the power amplifier usually is biased at lower bias condition which is so called Class-AB or Class-B. However, this kind of bias condition introduce non-linear Capacitance variation, especially at higher output power. The nonlinear capacitance of Cgs mainly restrict the performance of the Class-AB power amplifier. Class-AB is usually biased at deep Class-AB closed to Class-B for high efficiency. As depicted in FIG. 1, however, the Cgs variation has a large swing at high power. The nonlinear capacitance of Cgs distorts the input large signal.

FIG. 2 (prior art) illustrates an NMOS power amplifier 200 combined with a PMOS transistor to achieve linearization of PA 200. The concept is to use the PMOS transistor MP to compensate the Cgs variation as illustrated in FIG. 1. The overall Cgs is the sum of the NMOS PA transistor capacitance Cgs,n and the PMOS transistor capacitance Cgs,p (e.g., Cgs=Cgs,n+Cgs,p). In ideal case, the resultant Cgs is constant, e.g., achieve perfect linearity. The PMOS linearizer can only compensate variation of Cgs of NMOS, and extra parasitic capacitance causes loss in gain. AM-PM distortion of the PA can be reduced by variation reduction in Cgs variation, but linearized power range is low.

A power amplifier linearization technique with a wider linearized power range is desired.

SUMMARY

A power amplifier (PA) linearization technique with a wider linearized power range is proposed. Proposed two types of linearizers with cross-coupled PMOS and NMOS configuration. The idea is to use a complimentary device compared with the PA core device, and the behavior of Cgs of the linearizer are also complimentary to the PA itself. In the other words, the overall Cgs of the PA with the linearizer would be constant without leading to non-linear waveform. Both linearizers can effectively compensate not only AMAM but also AMPM. First type of linearizer can be integrated with PA cores, and second type of linearizer can be used in the IMN. Both linearizers have effective IM3 reduction in different corner.

In one embodiment, a PA receives input signals from an input node of the power amplifier. The PA amplifies the input signals by a complementary differential NMOS transistor pair of MN1 and MN2, MN1 gate and MN2 gate are coupled to the input node, and MN1 drain and MN2 drain are coupled to the output node. The differential transistor pair has a capacitor Cgs,n. The PA compensates a nonlinearity using a cross-coupled PMOS transistor pair of MP1 and MP2, the gate of MP1 is coupled to the gate of MN1 and the drain of MP2, and the gate of MP2 is couple to the gate of MN2 and the drain of MP1. The PMOS transistor pair has a capacitor Cgs,p to improve linearity of the power amplifier. The PA generates output signals onto the output node of the power amplifier. In one embodiment, a size of the PMOS transistor pair is selected to compensate a capacitance variation of Cgs,n and to improve linearity of the power amplifier.

In another embodiment, a linearized PA receives input radio frequency (RF) signals from an input node. The linearized PA amplifies the input RF signals by one or more power amplifiers onto an output node. The linearized PA compensates a nonlinearity of the one or more power amplifiers using a cross-coupled NMOS transistor pair of MN1 and MN2, the gate of MN1 is coupled to the drain of MN2, and the gate of MN2 is couple to the drain of MN1. The NMOS transistor pair is combined with a transformer, the transformer is serially coupled to the input node and the one or more power amplifiers to improve linearity of the linearized PA. Finally, the linearized PA generates output RF signals onto the output node of the linearized PA. In one embodiment, the linearity of the linearized PA is improved by reducing an input impedance variation of the linearized PA.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
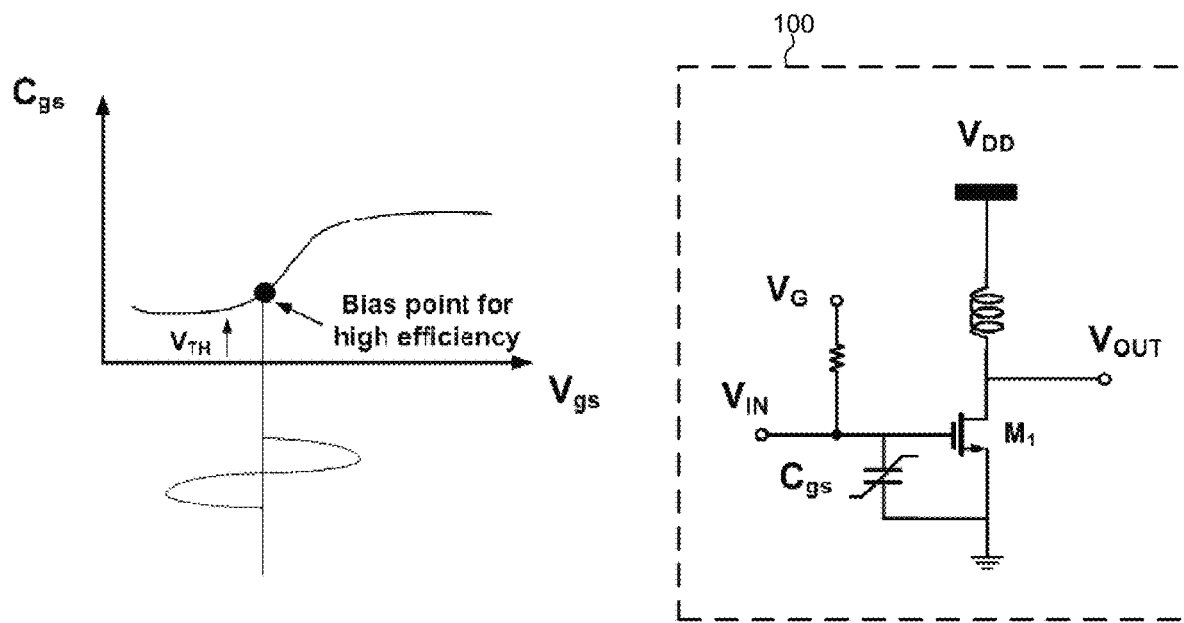
FIG. 1 (prior art) illustrates an NMOS power amplifier PA biased at lower bias condition.
Figure 2:
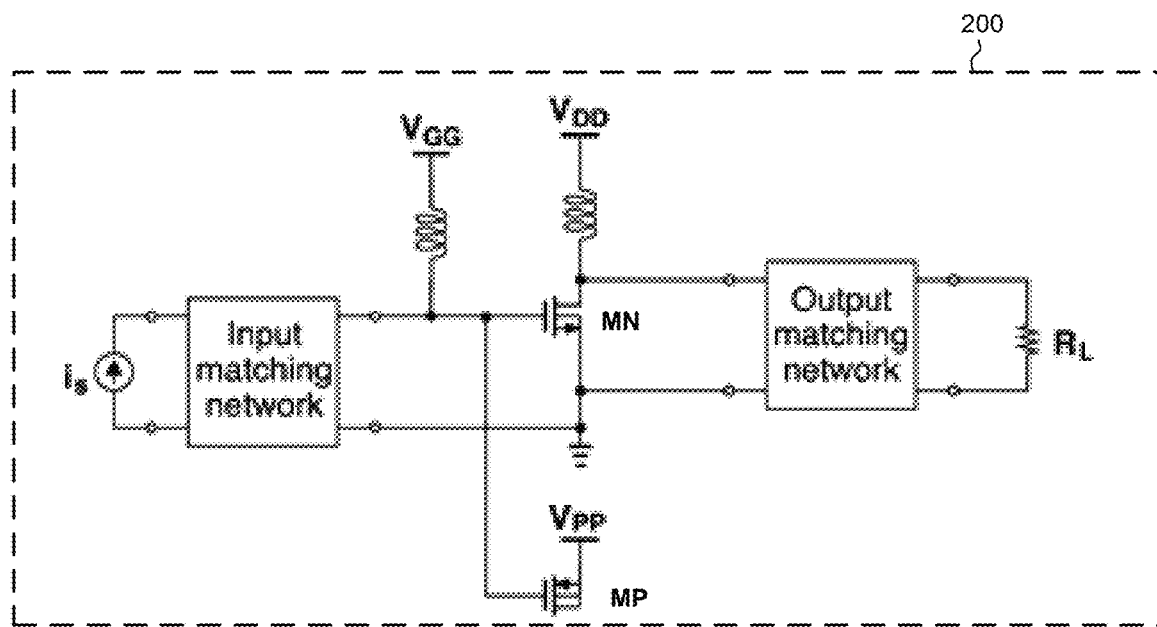
FIG. 2 (prior art) illustrates an NMOS power amplifier PA using a PMOS linearizer to compensate variation of Cgs of the NMOS PA.
Figure 3:
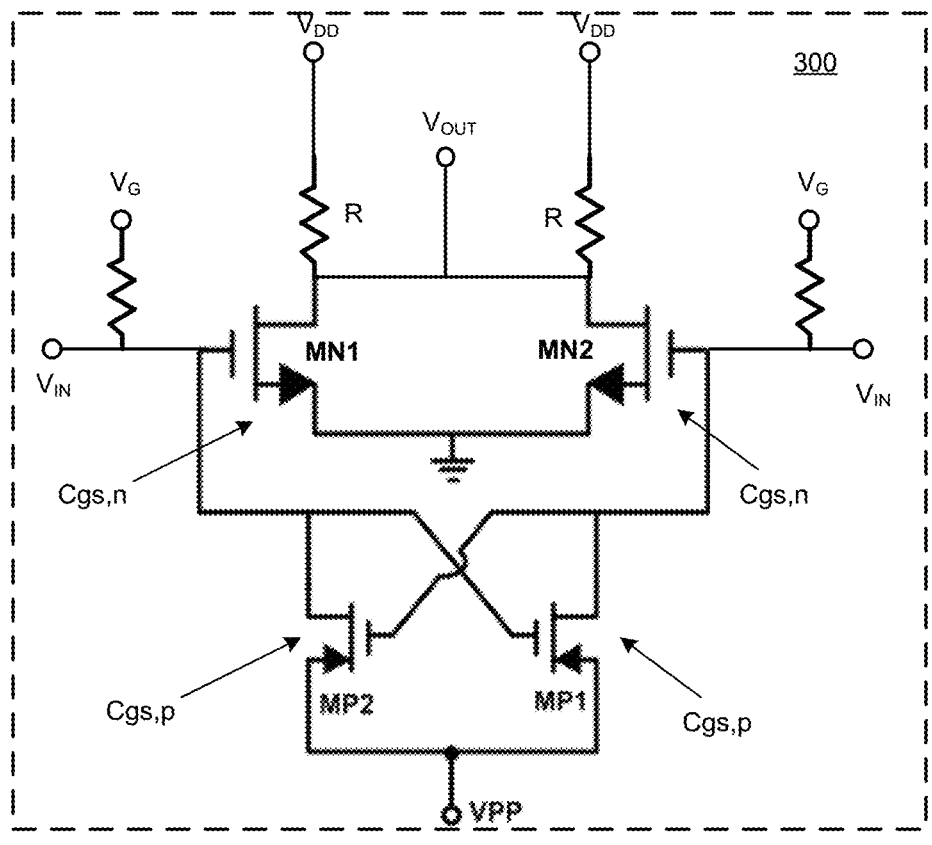
FIG. 3 illustrates a first embodiment of a CMOS differential power amplifier with a transconductance Gm linearizer and a cross-coupled configuration in accordance with one novel aspect.
Figure 3:
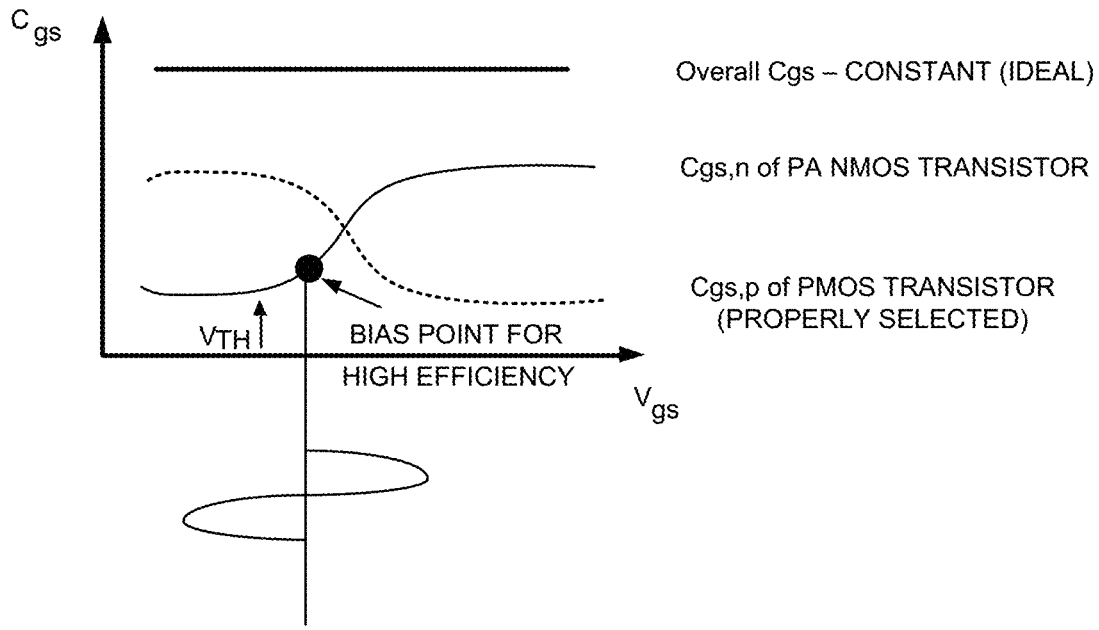

FIG. 3 illustrates a first embodiment of a CMOS differential power amplifier PA 300 with a transconductance Gm linearizer and a cross-coupled configuration in accordance with one novel aspect. NMOS is an n-type metal-oxide-semiconductor field-effect transistor (MOSFET). An NMOS transistor consists of n-type source and drain and a p-type substrate. When a voltage is applied to the gate, holes in the body (p-type substrate) are driven away from the gate. This allows the formation of an n-type channel between the source and the drain, and a current is conducted from electrons from the source to the drain through an induced n-type channel. PMOS is a p-type MOSFET. A PMOS transistor consists of a p-type source and drain and an n-type substrate. When a positive voltage is applied between source and gate (negative voltage between gate and source), a p-type channel with opposite polarities is formed between source and drain. A current is passed through holes from the source to the drain through a p-type induced channel. CMOS technology is the combination of NMOS and PMOS.

Power amplifier PA 300 comprises a complementary differential NMOS transistor pair of MN1 and MN2. Due to the nonlinear current-voltage (I-V) characteristic curve of CMOS transistors, a power amplifier is inherently nonlinear. The nonlinearity causes undesirable input to output distortion. The AM-AM distortion is the difference between the supply voltage and the envelope of the RF output voltage. AM-PM distortion is an unwanted phase modulation of the RF output carrier due to the modulation of the supply voltage. To improve the power amplifier efficiency without compromising its linearity, power amplifier linearity is essential.

In accordance with one novel aspect, a wideband amplifier linearization technique is proposed, which employs a novel transconductance Gm linearizer that achieves linearization to extend the linear output power range without burning more power consumption. In a first embodiment depicted by FIG. 3, PA 300 comprises a complementary differential NMOS transistor pair of MN1 and MN2, and a cross-coupled PMOS transistor pair of MP1 and MP2. The gate of MP1 is coupled to the gate of MN1 and the drain of MP2, and the gate of MP2 is couple to the gate of MN2 and the drain of MP1. The differential NMOS transistor pair MN1 and MN2 has a parasitic capacitor Cgs,n, and the cross-coupled PMOS transistor pair MP1 and MP2 has a parasitic capacitor Cgs,p, the parasitic capacitor Cgs,p can be used to improve the overall Cgs linearity of the CMOS differential PA 300.

FIG. 3 further illustrates the Cgs–Vgs curve of the CMOS power amplifier PA 300 using PMOS linearizer to compensate variation of Cgs of the CMOS PA 300. In general, a PMOS transistor has a complementary nonlinear capacitance variation, which can be used to compensate the capacitance variation of Cgs of an NMOS transistor. As depicted in FIG. 3, the capacitance of parasitic capacitor Cgs,n of the differential NMOS transistor pair (MN1 and MN2) increases with Vgs, while the capacitance of parasitic capacitor Cgs,p of the cross-coupled PMOS transistor pair (MP1 and MP2) decreases with Vgs. In one example, the PMOS size of MP1 and MP2 can be selected properly to have complementary capacitance variation. In another example, Vpp can be determined by Vth,n–Vth,p, size ratio of PMOS and NMOS. As a result, the overall capacitance Cgs of CMOS PA 300 is the sum of the NMOS PA transistor capacitance Cgs,n and the PMOS transistor capacitance Cgs,p (e.g., Cgs=Cgs,n+Cgs,p). In ideal case, the resultant Cgs is constant, e.g., achieve perfect linearity for the CMOS PA 300.

Figure 4A:
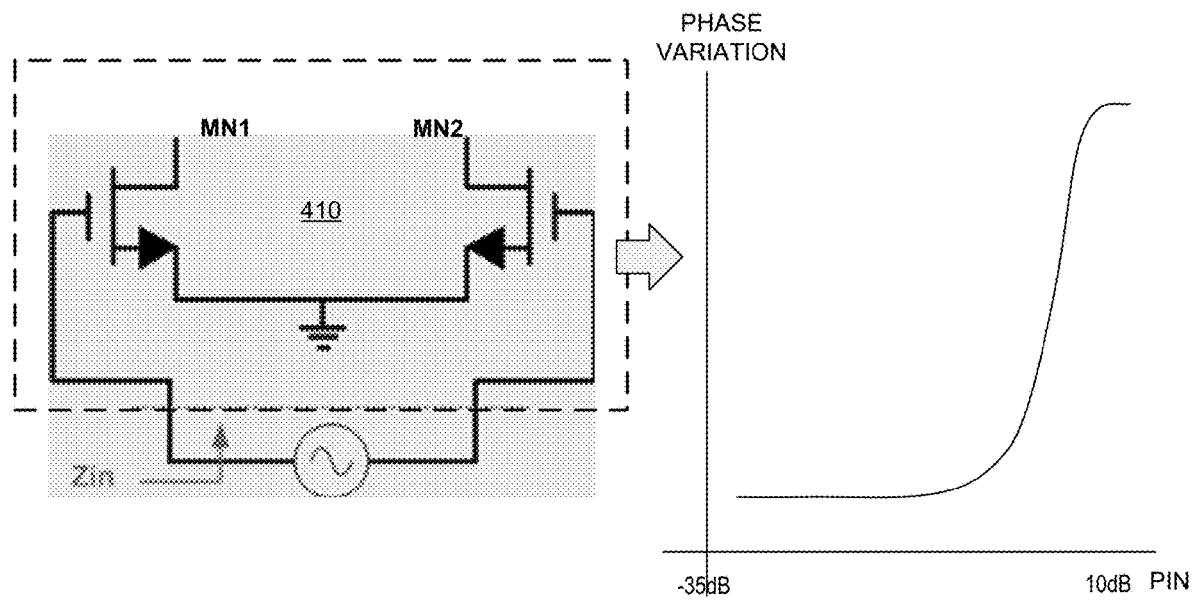
FIG. 4A illustrates the input impedance and phase variation of an NMOS power amplifier itself without the PMOS linearizer.

FIG. 4A illustrates the input impedance and phase variation of an NMOS power amplifier 410 itself without the PMOS linearizer. FIG. 4A depicts the input impedance Zin and phase variation vs. bias voltage Vg and input power Pin at a radio frequency of 28.5 GHz: 1) sweep Vg to model dynamic bias driven by Pin; 2) drive PA with RF signal to realize the AM/PM. The phase variation vs. 28.5 GHz Pin from −35 dB to 10 dB.

Figure 4B:
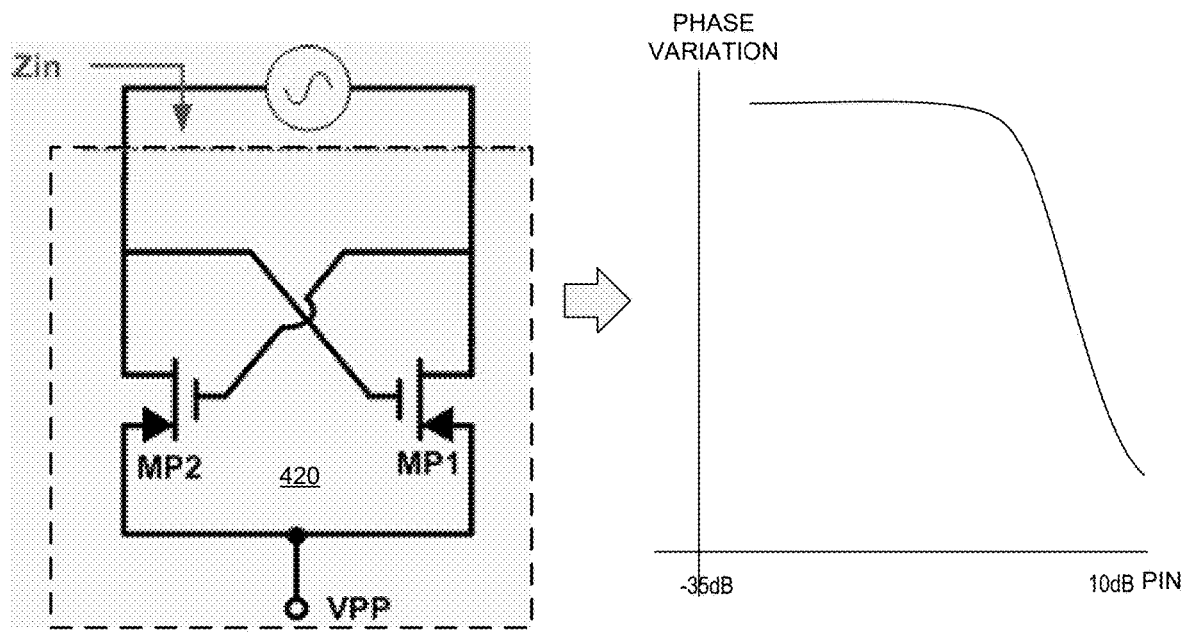
FIG. 4B illustrates the input impedance and phase variation of a cross-coupled PMOS transistor pair.

FIG. 4B illustrates the input impedance and phase variation of a cross-coupled PMOS transistor pair 420. FIG. 4B depicts the input impedance Zin and phase variation vs. bias voltage Vg and input power Pin at a radio frequency of 28.5 GHz: 1) sweep Vg to model dynamic bias driven by Pin; 2) drive PA with RF signal to realize the AM/PM. The phase variation vs. 28.5 GHz Pin from −35 dB to 10 dB.

Figure 5:
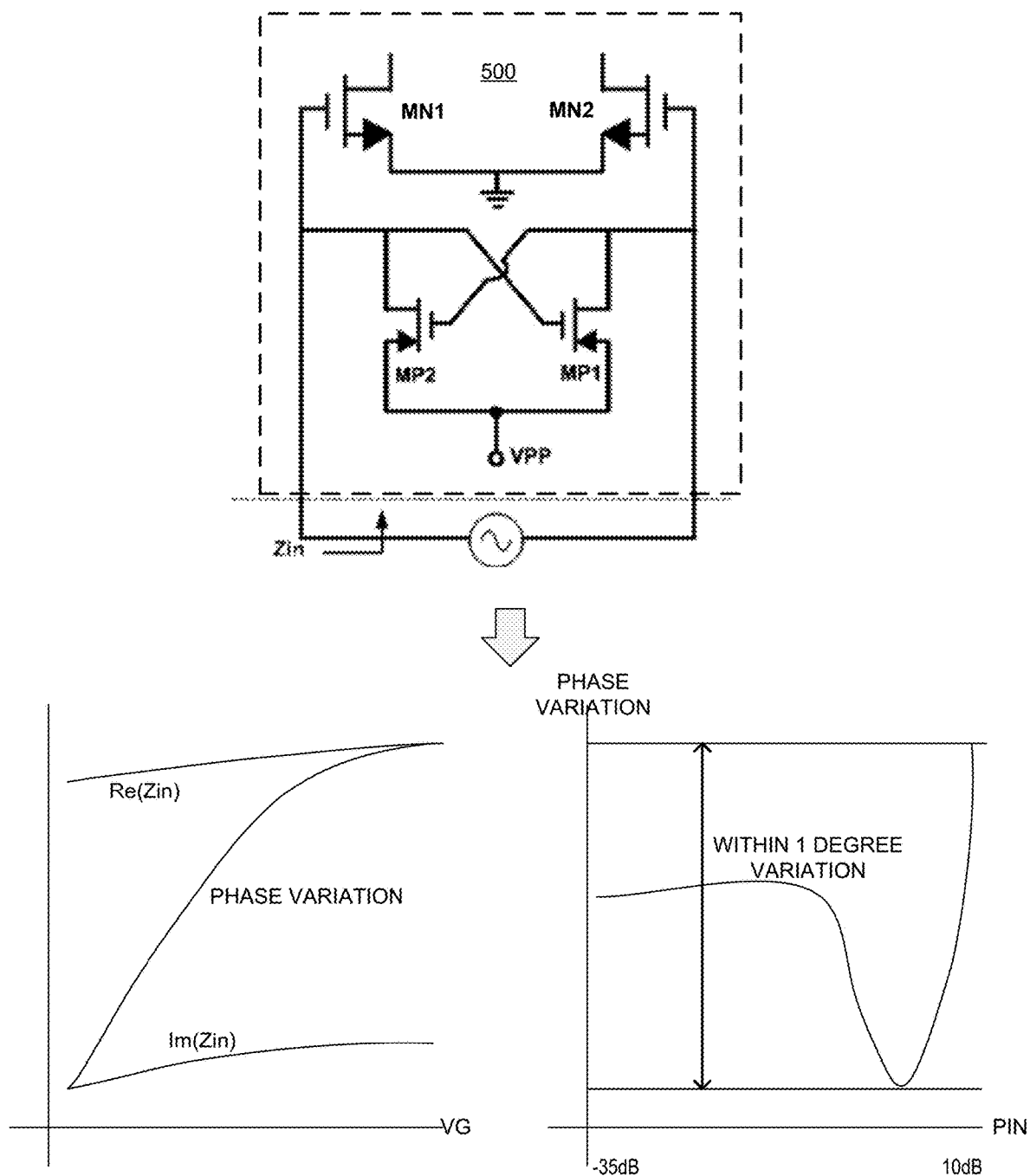
FIG. 5 illustrates the input impedance and phase variation vs Vg and Pin of a CMOS power amplifier with PMOS linearizer in accordance with one novel aspect.

FIG. 5 illustrates the input impedance and phase variation vs Vg and Pin of a CMOS power amplifier 500 with PMOS linearizer in accordance with one novel aspect. The idea is to use a complimentary device (the cross-coupled PMOS transistor pair as the linearizer) compared with the PA core device (the differential NMOS transistor pair), and the behavior of the linearizer are also complimentary to the CMOS PA itself. In the other words, the overall Cgs of the CMOS PA with the linearizer would be constant without leading to non-linear waveform. FIG. 5 depicts the input impedance Zin and phase variation vs. bias voltage Vg and input power Pin at a radio frequency of 28.5 GHz: 1) sweep Vg to model dynamic bias driven by Pin; 2) drive PA with RF signal to realize the AM/PM. As depicted in FIG. 5, the input impedance variation over wide power range from −35 dB to 10 dB is much reduced and the AM-PM distortion is also mitigated from 5+ degree to <1 degree.

Figure 6:
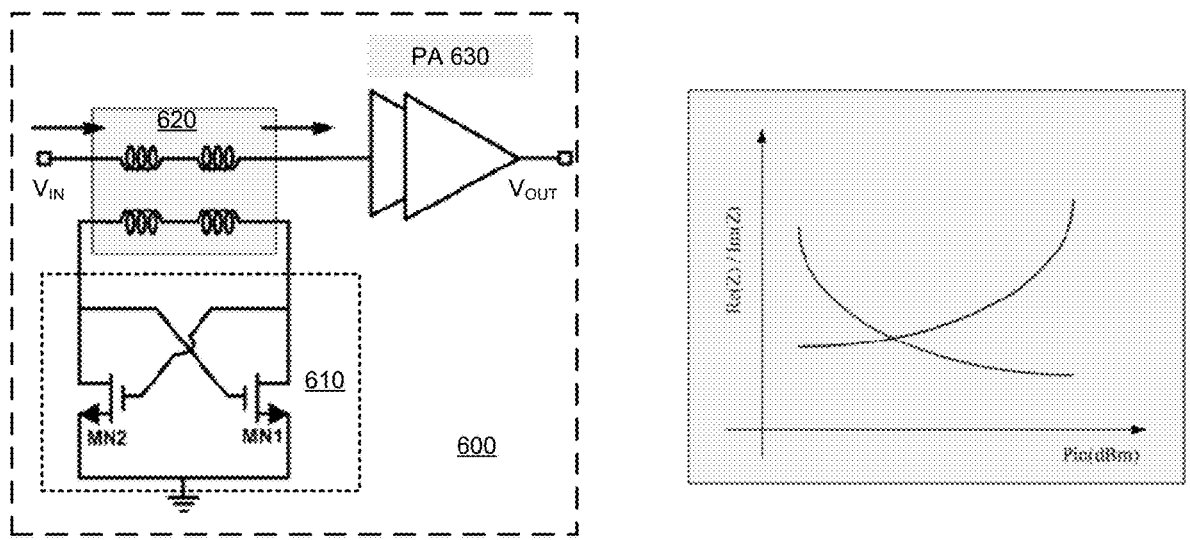
FIG. 6 illustrates a second embodiment of a linearized power amplifier with a cross-coupled NMOS transistor pair combined with a transformer and put in series in the signal path in accordance with one novel aspect.

FIG. 6 illustrates a second embodiment of a linearized power amplifier 600 with a cross-coupled NMOS transistor pair 610 combined with a transformer coupler 620 and put in series in the signal path of power amplifier(s) 630 in accordance with one novel aspect. FIG. 6 shows the cross-coupled NMOS transistor pair 610 has high impedance as Pin is low, and the input impedance of cross-coupled NMOS transistor pair 610 becomes smaller as Pin increasing with larger swing. The impedance variation and phase variation looked into the primary coil of the transformer coupler in series with the signal path shows a potential to compensate the AM-AM and AM-PM distortion phenomena of the PA 630. As a result, the overall impedance and phase variation of PA 600 is reduced. In one embodiment, by properly selecting the NMOS transistor and the transformer coupler size, linearization of PA 600 can be achieved. In one embodiment, the cross-coupled NMOS transistor pair and the transformer coupler belong to part of an input matching network (IMN) to achieve input impedance matching. In addition, the output of PA 630 is coupled to an output matching network (OMN) to achieve output impedance matching.

Figure 7:
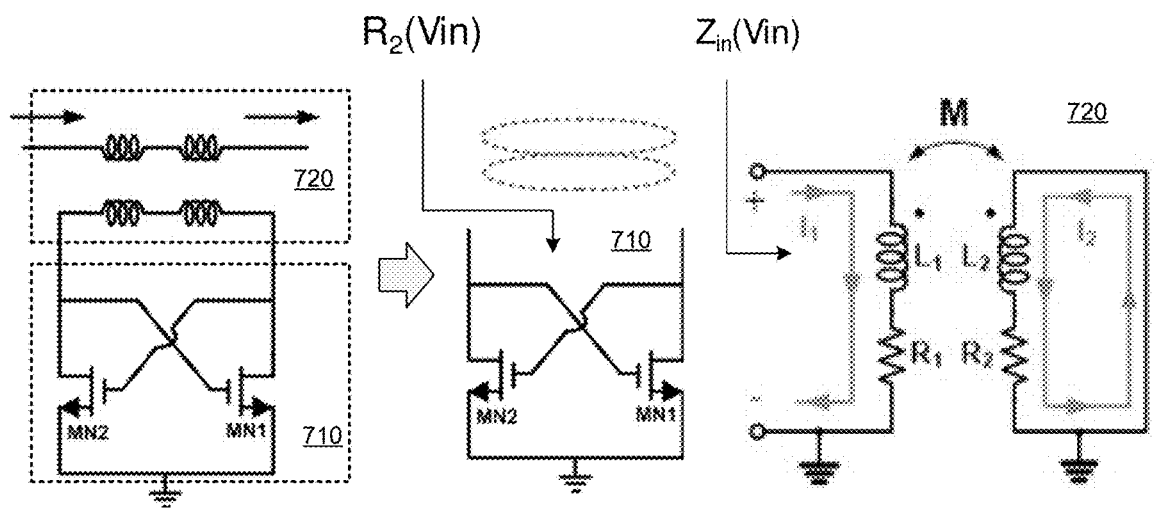
FIG. 7 illustrates the input impedance variation of the cross-coupled NMOS transistor pair combined with a transformer in accordance with one novel aspect.

FIG. 7 illustrates the input impedance variation of the cross-coupled NMOS 710 combined with a transformer 720 in accordance with one novel aspect.

$$\begin{cases} V_1 = L_1 \frac{dI_1}{dt} + I_1 R_1 + M \frac{dI_2}{dt} \\ 0 = L_2 \frac{dI_2}{dt} + I_2 R_2 + M \frac{dI_1}{dt} \end{cases}$$

$$\begin{cases} V_1 = sL_1 I_1 + I_1 R_1 + sMI_2 \\ 0 = sL_2 I_2 + I_2 R_2 + sMI_1 \end{cases}$$

$$I_2 = \left(\frac{-sM}{sL_2 + R_2}\right) I_1$$

$$V_1 = V_1 = sL_1 I_1 + I_1 R_1 + sM\left(\frac{-sM}{sL_2 + R_2}\right) I_1$$

$$Z_{in} = \frac{V_1}{I_1} = j\omega\left(L_1 - \frac{\omega^2 M^2 L_2}{R_2^2 + \omega^2 L_2^2}\right) + \frac{\omega^2 M^2 R_2}{R_2^2 + \omega^2 L_2^2}$$

In moderately high Pin, the $2^{nd}$ coil L2 is not open.

$$Z_{in} = \frac{V_1}{I_1} = j\omega\left(L_1 - \frac{M^2}{L_2}\right) + \frac{M^2 R_2}{L_2^2} =$$

$$j\omega\left(L_1 - \frac{k^2 L_1 L_2}{L_2}\right) + \frac{k^2 L_1 L_2 R_2}{L_2^2} = j\omega L_1(1 - k^2) + \frac{k^2 L_1 R_2}{L_2}$$

To summarize, two kinds of PA linearizer with cross-coupled NMOS and PMOS transistor pair are proposed. Both linearizers can effectively compensate not only AMAM but also AMPM. Embodiment one as illustrated in FIG. 3 (linearizer using cross-coupled PMOS transistor pair), can be integrated with PA cores. Embodiment two as illustrated in FIG. 6 (linearizer using cross-coupled NMOS transistor pair combined with a transformer), can be used in input matching network (IMN). Both linearizer have effective IM3 reduction in different corner. With the same control bias of linearizer, linearizer still provide sweet spots—not sensitive to temperature.

Figure 8:
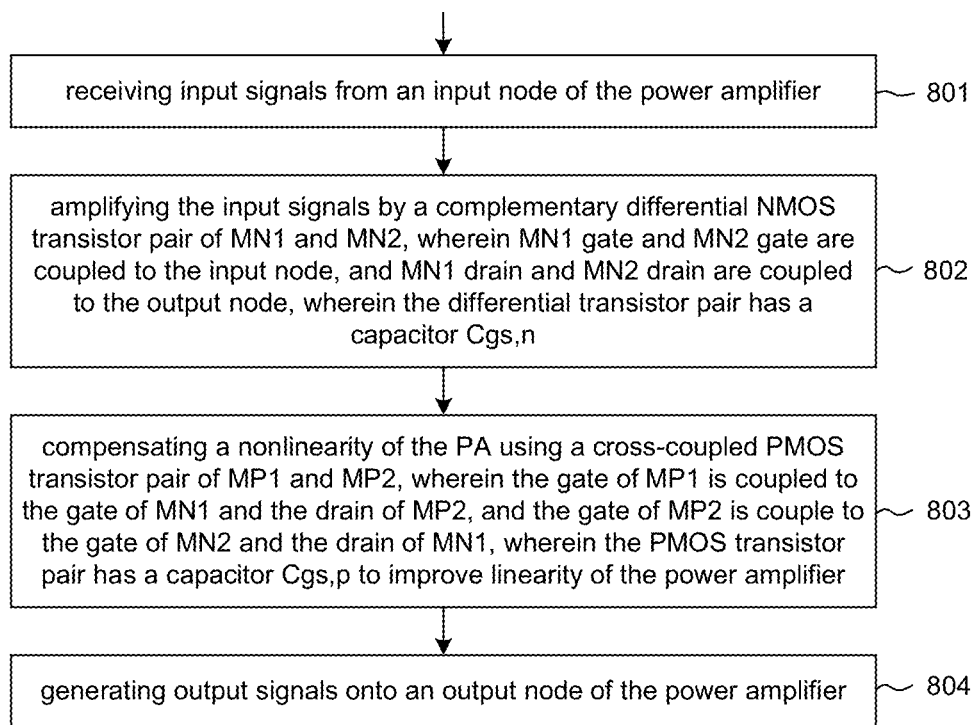
FIG. 8 is a flow chart of a method of power amplifier linearization with a wider linearized power range in accordance with a novel aspect.

FIG. 8 is a flow chart of a method of power amplifier linearization with a wider linearized power range in accordance with a novel aspect. In step 801, the PA receives input signals from an input node of the power amplifier. In step 802, the PA amplifies the input signals by a complementary differential NMOS transistor pair of MN1 and MN2, MN1 gate and MN2 gate are coupled to the input node, and MN1 drain and MN2 drain are coupled to the output node. The differential transistor pair has a capacitor Cgs,n. In step 803, the PA compensates a nonlinearity using a cross-coupled PMOS transistor pair of MP1 and MP2, the gate of MP1 is coupled to the gate of MN1 and the drain of MP2, and the gate of MP2 is couple to the gate of MN2 and the drain of MN1. The PMOS transistor pair has a capacitor Cgs,p to improve linearity of the power amplifier. In step 804, the PA generates output signals onto the output node of the power amplifier. In one embodiment, a size of the PMOS transistor pair is selected to compensate a capacitance variation of Cgs,n and to improve linearity.

Figure 9:
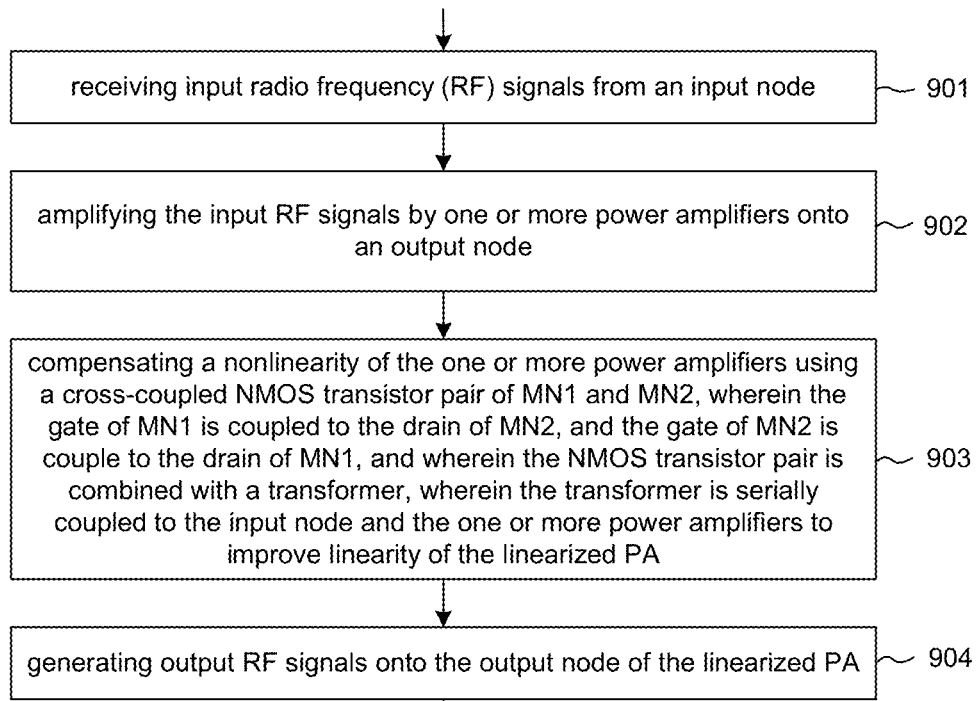
FIG. 9 is a flow chart of another method of power amplifier linearization with a wider linearized power range in accordance with a novel aspect.

FIG. 9 is a flow chart of another method of power amplifier linearization with a wider linearized power range in accordance with a novel aspect. In step 901, a linearized PA receives input radio frequency (RF) signals from an input node. In step 902, the PA amplifies the input RF signals by one or more power amplifiers onto an output node. In step 903, the PA compensates a nonlinearity of the one or more power amplifiers using a cross-coupled NMOS transistor pair of MN1 and MN2, the gate of MN1 is coupled to the drain of MN2, and the gate of MN2 is couple to the drain of MN1. The NMOS transistor pair is combined with a transformer, the transformer is serially coupled to the input node and the one or more power amplifiers to improve linearity of the linearized PA. In step 904, the PA generates output RF signals onto the output node of the linearized PA. In one embodiment, the linearity of the linearized PA is improved by reducing an input impedance variation.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A power amplifier (PA), comprising:
   an input node that receives input signals;
   an output node that generates amplified output signals;
   a complementary differential NMOS transistor pair of MN1 and MN2, wherein MN1 gate and MN2 gate are coupled to the input node, and MN1 drain and MN2 drain are coupled to the output node, wherein the differential transistor pair has a capacitor Cgs,n; and
   a cross-coupled PMOS transistor pair of MP1 and MP2, wherein the gate of MP1 is coupled to the gate of MN1 and the drain of MP2, and the gate of MP2 is couple to the gate of MN2 and the drain of MP1, wherein the PMOS transistor pair has a capacitor Cgs,p to improve linearity of the power amplifier.

2. The PA of claim 1, wherein the linearity of the power amplifier is improved by reducing a capacitance variation of the power amplifier.

3. The PA of claim 2, wherein the power amplifier has a capacitor having an equivalent capacitance of Cgs=Cgs,n+Cgs,p, and wherein the capacitance variation of Cgs is reduced as compared to Cgs,n.

4. The PA of claim 1, wherein the linearity of the power amplifier is improved by reducing an input impedance variation as a result of a signal swing of the power amplifier.

5. The PA of claim 1, wherein a size of the PMOS transistor pair is selected to compensate a capacitance variation of Cgs,n.

6. A method performed by a power amplifier (PA), comprising:
   receiving input signals from an input node of the power amplifier;
   amplifying the input signals by a complementary differential NMOS transistor pair of MN1 and MN2, wherein MN1 gate and MN2 gate are coupled to the input node, and MN1 drain and MN2 drain are coupled to an output node, wherein the differential transistor pair has a capacitor Cgs,n;
   compensating a nonlinearity of the PA using a cross-coupled PMOS transistor pair of MP1 and MP2, wherein the gate of MP1 is coupled to the gate of MN1 and the drain of MP2, and the gate of MP2 is couple to the gate of MN2 and the drain of MP1, wherein the PMOS transistor pair has a capacitor Cgs,p to improve linearity of the power amplifier; and generating output signals onto the output node of the power amplifier.

7. The method of claim 6, wherein the linearity of the power amplifier is improved by reducing a capacitance variation of the power amplifier.

8. The method of claim 7, wherein the power amplifier has a capacitor having an equivalent capacitance of $C_{gs}=C_{gs,n}+C_{gs,p}$, and wherein the capacitance variation of $C_{gs}$ is reduced as compared to $C_{gs,n}$.

9. The method of claim 6, wherein the linearity of the power amplifier is improved by reducing an input impedance variation as a result of a signal swing of the power amplifier.

10. The method of claim 6, wherein a size of the PMOS transistor pair is selected to compensate a capacitance variation of $C_{gs,n}$.

* * * * *